(12) United States Patent
Sato et al.

(10) Patent No.: US 11,496,704 B2
(45) Date of Patent: Nov. 8, 2022

(54) PHOTOELECTRIC CONVERSION DEVICE HAVING SELECT CIRCUIT WITH A SWITCH CIRCUIT HAVING A PLURALITY OF SWITCHES, AND IMAGING SYSTEM

(71) Applicant: CANON KABUSHIKI KAISHA, Tokyo (JP)

(72) Inventors: Masaki Sato, Yokohama (JP); Kazuhiro Saito, Tokyo (JP); Tetsuya Itano, Sagamihara (JP); Kazuo Yamazaki, Yokohama (JP); Hideo Kobayashi, Tokyo (JP); Keigo Nakazawa, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 169 days.

(21) Appl. No.: 16/917,513

(22) Filed: Jun. 30, 2020

(65) Prior Publication Data

US 2021/0021782 A1 Jan. 21, 2021

(30) Foreign Application Priority Data

Jul. 19, 2019 (JP) .............................. JP2019-133524

(51) Int. Cl.
*H04N 5/378* (2011.01)
*H04N 5/3745* (2011.01)
(Continued)

(52) U.S. Cl.
CPC ............. *H04N 5/378* (2013.01); *B60R 11/04* (2013.01); *H03M 1/123* (2013.01); *H03M 1/56* (2013.01);
(Continued)

(58) Field of Classification Search
CPC ...... H04N 5/3658; H03M 1/56; H03M 1/123; H03M 1/34
See application file for complete search history.

(56) References Cited

U.S. PATENT DOCUMENTS 7,126,102 B2 10/2006 Inoue
7,230,561 B2 * 6/2007 Lee ........................... G06J 1/00
341/172

(Continued)

FOREIGN PATENT DOCUMENTS

JP 2013-30997 2/2013

OTHER PUBLICATIONS

U.S. Appl. No. 16/990,292, filed Aug. 11, 2020 by Takanori Yamashita et al.
(Continued)

*Primary Examiner* — John Villecco
(74) *Attorney, Agent, or Firm* — Venable LLP

(57) ABSTRACT

A photoelectric conversion device includes: pixels forming columns and each configured to output a pixel signal; and comparator units provided to respective columns and each configured to receive the pixel signal from the pixels on a corresponding column and the reference signal. Each comparator unit includes a comparator having a first input node that receives the pixel signal and a second input node that receives the reference signal, a first capacitor that connects a reference signal line and the second input node, a second capacitor whose one electrode is connected to the second input node, and a select unit that connects the other electrode of the second capacitor to either the reference signal line or a reference voltage line. The other electrode of the second capacitor is connected to the reference signal line during first mode AD conversion and connected to the reference voltage line during second mode AD conversion.

15 Claims, 6 Drawing Sheets

(51) Int. Cl.
*B60R 11/04* (2006.01)
*H04N 5/365* (2011.01)
*H03M 1/56* (2006.01)
*H03M 1/12* (2006.01)

(52) U.S. Cl.
CPC ....... *H04N 5/3658* (2013.01); *H04N 5/37455* (2013.01); *H04N 5/37457* (2013.01); *B60R 2300/301* (2013.01); *B60R 2300/303* (2013.01); *B60R 2300/8093* (2013.01)

(56) References Cited

U.S. PATENT DOCUMENTS

| | | |
|---|---|---|
| 7,321,110 B2 | 1/2008 | Okita |
| 7,385,172 B2 | 6/2008 | Inoue |
| 7,408,210 B2 | 8/2008 | Ogura |
| 7,423,790 B2 | 9/2008 | Kochi |
| 7,460,162 B2 | 12/2008 | Koizumi |
| 7,462,810 B2 | 12/2008 | Kobayashi |
| 7,528,878 B2 | 5/2009 | Sato |
| 7,550,793 B2 | 6/2009 | Itano |
| 7,592,579 B2 | 9/2009 | Tamura |
| 7,709,780 B2 | 5/2010 | Inoue |
| 7,719,587 B2 | 5/2010 | Ogura |
| 7,741,593 B2 | 6/2010 | Iwata |
| 7,816,755 B2 | 10/2010 | Yamazaki |
| 7,825,974 B2 | 11/2010 | Itano |
| 7,889,254 B2 | 2/2011 | Koichi |
| 7,920,192 B2 | 4/2011 | Watanabe |
| 7,978,241 B2 | 7/2011 | Koizumi |
| 7,982,789 B2 | 7/2011 | Watanabe |
| 7,990,440 B2 | 8/2011 | Kobayashi |
| 8,023,025 B2 | 9/2011 | Itano |
| 8,049,799 B2 | 11/2011 | Sonoda |
| 8,063,351 B2 | 11/2011 | Kobayashi |
| 8,063,958 B2 | 11/2011 | Okita |
| 8,063,967 B2 | 11/2011 | Itano |
| 8,081,245 B2 | 12/2011 | Itano |
| 8,085,319 B2 | 12/2011 | Ono |
| 8,159,577 B2 | 4/2012 | Iwata |
| 8,289,431 B2 | 10/2012 | Itano |
| 8,325,260 B2 | 12/2012 | Yamazaki |
| 8,355,066 B2 | 1/2013 | Iwata |
| 8,363,137 B2 | 1/2013 | Sonoda |
| 8,368,790 B2 | 2/2013 | Itano |
| 8,390,708 B2 | 3/2013 | Koizumi |
| 8,400,546 B2 | 3/2013 | Itano |
| 8,411,187 B2 | 4/2013 | Watanabe |
| 8,441,558 B2 | 5/2013 | Okita |
| 8,482,447 B2* | 7/2013 | Hwang .................. H04N 5/378 341/169 |
| 8,553,118 B2 | 10/2013 | Saito |
| 8,598,901 B2 | 12/2013 | Hiyama |
| 8,670,049 B2 | 3/2014 | Ono |
| 8,698,935 B2 | 4/2014 | Okita |
| 8,710,558 B2 | 4/2014 | Inoue |
| 8,711,259 B2 | 4/2014 | Maehashi |
| 8,743,258 B2* | 6/2014 | Park ..................... H04N 5/357 348/308 |
| 8,749,675 B2 | 6/2014 | Koizumi |
| 8,760,337 B2 | 6/2014 | Yamazaki |
| 8,810,706 B2 | 8/2014 | Yamazaki |
| 8,835,828 B2 | 9/2014 | Kobayashi |
| 8,836,313 B2 | 9/2014 | Takagi |
| 8,836,838 B2 | 9/2014 | Nakamura |
| 8,884,391 B2 | 11/2014 | Fudaba |
| 8,896,029 B2 | 11/2014 | Koizumi |
| 8,928,786 B2 | 1/2015 | Iwata |
| 9,029,752 B2* | 5/2015 | Saito ................ H01L 27/14609 250/214 R |
| 9,055,250 B2* | 6/2015 | Park ..................... H04N 5/357 |
| 9,060,139 B2 | 6/2015 | Yamazaki |
| 9,083,906 B2 | 7/2015 | Nakamura |
| 9,118,857 B2 | 8/2015 | Iwata |
| 9,232,165 B2 | 1/2016 | Saito |
| 9,264,641 B2 | 2/2016 | Kobayashi |
| 9,288,415 B2* | 3/2016 | Yamazaki ............. H04N 5/363 |
| 9,305,954 B2 | 4/2016 | Kato |
| 9,337,222 B2 | 5/2016 | Saito |
| 9,357,122 B2 | 5/2016 | Kususaki |
| 9,407,839 B2* | 8/2016 | Yoshida ................ H03M 1/34 |
| 9,407,847 B2 | 8/2016 | Maehashi |
| 9,438,828 B2 | 9/2016 | Itano |
| 9,438,841 B2* | 9/2016 | Yamazaki ............. H04N 5/378 |
| 9,509,931 B2 | 11/2016 | Kobayashi |
| 9,549,135 B2* | 1/2017 | Kito ...................... H04N 5/378 |
| 9,602,752 B2 | 3/2017 | Kobayashi |
| 9,602,753 B2 | 3/2017 | Saito |
| 9,667,901 B2 | 5/2017 | Sasaki |
| 9,681,076 B2 | 6/2017 | Oguro |
| 9,723,238 B2* | 8/2017 | Lee ...................... H04N 5/3745 |
| 9,749,571 B2* | 8/2017 | Endo .................... H04N 5/3658 |
| 9,762,840 B2 | 9/2017 | Yamazaki |
| 9,825,077 B2 | 11/2017 | Watanabe |
| 9,848,154 B2* | 12/2017 | Kim .................... H04N 5/37452 |
| 9,900,539 B2 | 2/2018 | Yamasaki |
| 10,015,430 B2 | 7/2018 | Kobayashi |
| 10,051,223 B2 | 8/2018 | Yamashita |
| 10,057,529 B2 | 8/2018 | Saito |
| 10,194,103 B2 | 1/2019 | Saito |
| 10,291,250 B2* | 5/2019 | Kim ...................... H04N 5/378 |
| 10,403,658 B2 | 9/2019 | Takada |
| 10,411,724 B2* | 9/2019 | Kim .................... H04N 5/37455 |
| 10,504,949 B2 | 12/2019 | Kobayashi |
| 10,531,033 B2 | 1/2020 | Morita |
| 10,609,243 B2 | 3/2020 | Ochiai |
| 10,609,316 B2 | 3/2020 | Kobayashi |
| 10,609,320 B2 | 3/2020 | Kuroda |
| 10,645,325 B2 | 5/2020 | Takada |
| 10,652,531 B2 | 5/2020 | Kono |
| 10,778,920 B2 | 9/2020 | Yamashita |
| 2008/0284626 A1* | 11/2008 | Hattori .................. H04N 5/243 341/172 |
| 2011/0003426 A1 | 1/2011 | Watanabe |
| 2012/0001055 A1* | 1/2012 | Lee ....................... H04N 5/378 327/134 |
| 2012/0013778 A1 | 1/2012 | Sonoda |
| 2012/0133808 A1* | 5/2012 | Park ....................... G01J 1/46 348/294 |
| 2012/0175503 A1 | 7/2012 | Kuroda |
| 2013/0002916 A1 | 1/2013 | Itano |
| 2013/0026343 A1* | 1/2013 | Saito ................ H01L 27/14643 250/208.1 |
| 2013/0140440 A1 | 6/2013 | Kobayashi |
| 2014/0034812 A1* | 2/2014 | Ikuma .................. H04N 5/378 250/208.1 |
| 2014/0333813 A1* | 11/2014 | Park ..................... H04N 5/357 348/302 |
| 2015/0122975 A1* | 5/2015 | Saito ................... H03M 1/1023 250/208.1 |
| 2015/0244388 A1* | 8/2015 | Hashimoto ............ H04N 5/378 341/137 |
| 2016/0227141 A1 | 8/2016 | Kobayashi |
| 2018/0184031 A1* | 6/2018 | Morita .................. H04N 5/374 |
| 2018/0197907 A1 | 7/2018 | Wada |
| 2019/0141266 A1 | 5/2019 | Itano |
| 2019/0166323 A1 | 5/2019 | Saito |
| 2019/0224314 A1* | 7/2019 | Cho ....................... A61K 45/06 |
| 2019/0253067 A1* | 8/2019 | Sakai ................ H04N 5/35545 |
| 2019/0394416 A1 | 12/2019 | Kobayashi |
| 2020/0066772 A1 | 2/2020 | Kobayashi |
| 2020/0084397 A1 | 3/2020 | Yamazaki |
| 2020/0186738 A1 | 6/2020 | Takada |
| 2020/0228741 A1 | 7/2020 | Takado |
| 2020/0236348 A1 | 7/2020 | Kono |
| 2020/0314360 A1 | 10/2020 | Sakai |
| 2021/0021770 A1* | 1/2021 | Nakazawa ......... H04N 5/37452 |
| 2021/0392286 A1* | 12/2021 | Ebihara ............... H04N 5/3559 |

OTHER PUBLICATIONS

U.S. Appl. No. 16/884,236, filed May 27, 2020 by Hideo Kobayashi et al.

(56) References Cited

OTHER PUBLICATIONS

U.S. Appl. No. 16/928,202, filed Jul. 14,m 2020 by Hideo Kobayashi et al.
U.S. Appl. No. 16/925,595, filed Jul. 10, 2020 by Keigo Nakazawa et al.
U.S. Appl. No. 16/917,513, filed Jun. 30, 2020 Masaki Sato et al.

* cited by examiner

PHOTOELECTRIC CONVERSION DEVICE HAVING SELECT CIRCUIT WITH A SWITCH CIRCUIT HAVING A PLURALITY OF SWITCHES, AND IMAGING SYSTEM

BACKGROUND OF THE INVENTION

Field of the Invention

The present invention relates to a photoelectric conversion device and an imaging system.

Description of the Related Art

Photoelectric conversion devices such as a CMOS image sensor or the like with built-in analog-to-digital (AD) converter circuits have been used as image input devices of a digital camera or the like. Some AD converter circuits built in photoelectric conversion devices compare a pixel signal on each column with a common reference signal (ramp signal) to obtain digital data. Japanese Patent Application Laid-Open No. 2013-030997 discloses a technology, in the AD converter circuit using a ramp signal, for suppressing horizontal stripe noise due to noise that does not depend on the slope of the ramp signal when the AD conversion gain is switched by changing the slope of the ramp signal.

In the technology disclosed in Japanese Patent Application Laid-Open No. 2013-030997, however, the AD conversion gains may vary for respective columns, and vertical stripe noise may occur in an acquired image, in particular when a condition of a low AD conversion gain is set.

SUMMARY OF THE INVENTION

The present invention intends to provide a photoelectric conversion device that may reduce vertical stripe noise while suppressing horizontal stripe noise due to a reference signal generation circuit.

According to one aspect of the present invention, provided is a photoelectric conversion device including a plurality of pixels arranged to form a plurality of columns and each configured to output a pixel signal in accordance with a light amount of incident light, a reference signal generation circuit that generates a reference signal having a predetermined amplitude, a reference signal line on which the reference signal is transmitted, and a plurality of comparator units provided to corresponding ones of the plurality of columns and each configured to receive the pixel signal from the pixels on a corresponding column and the reference signal, wherein each of the plurality of comparator units includes a comparator having a first input node that receives the pixel signal and a second input node that receives the reference signal, a first capacitor that connects the reference signal line and the second input node to each other, a second capacitor whose one electrode is connected to the second input node, and a select unit that selectively connects the other electrode of the second capacitor to one of the reference signal line and a reference voltage line, and wherein the other electrode of the second capacitor is connected to the reference signal line during an AD conversion period in a first mode, and the other electrode of the second capacitor is connected to the reference voltage line during an AD conversion period in a second mode.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

A photoelectric conversion device and a method of driving the same according to a first embodiment of the present invention will be described with reference to FIG. 1 to FIG. 4.

Figure 1:
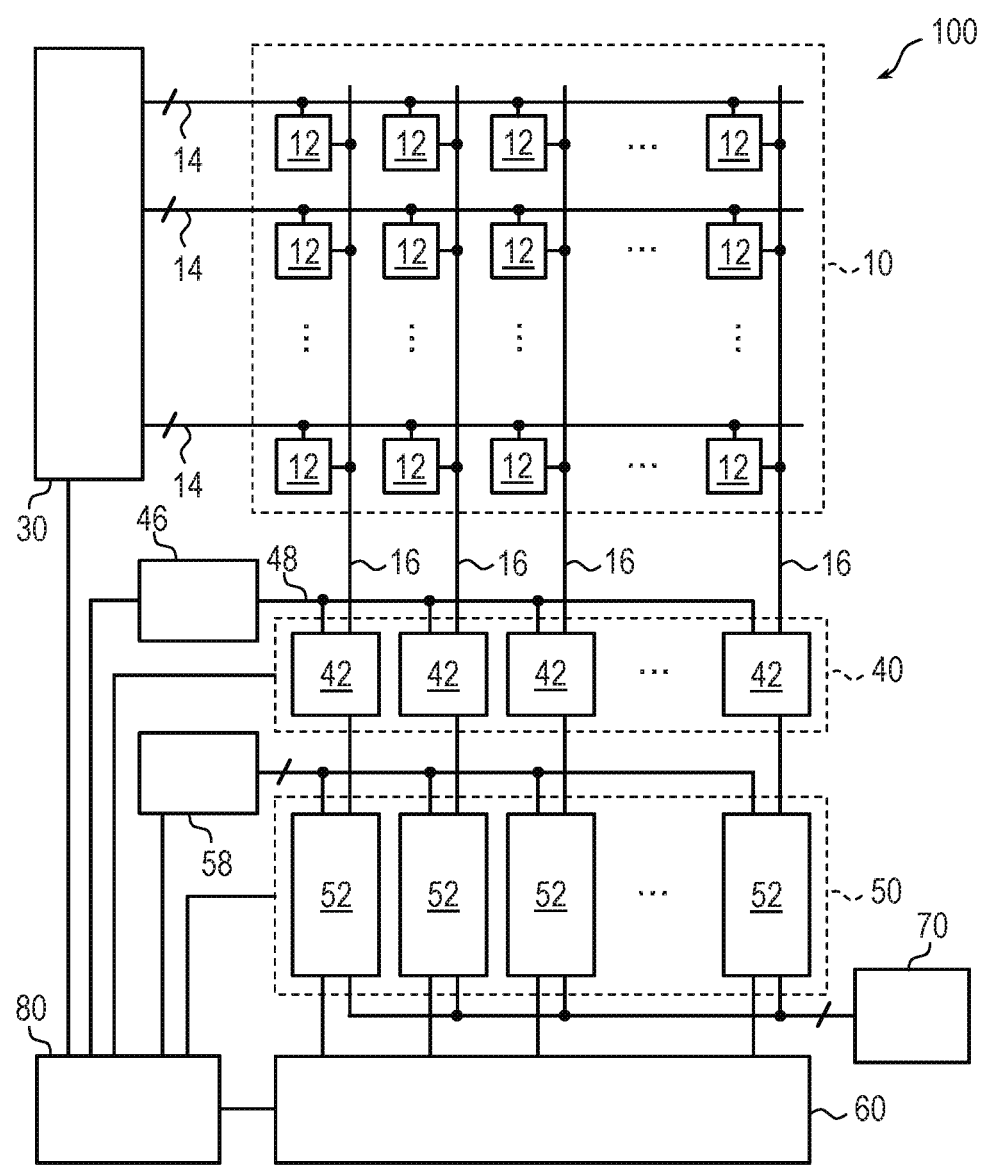
FIG. 1 is a block diagram illustrating a general configuration of a photoelectric conversion device according to a first embodiment of the present invention.
Figure 2:
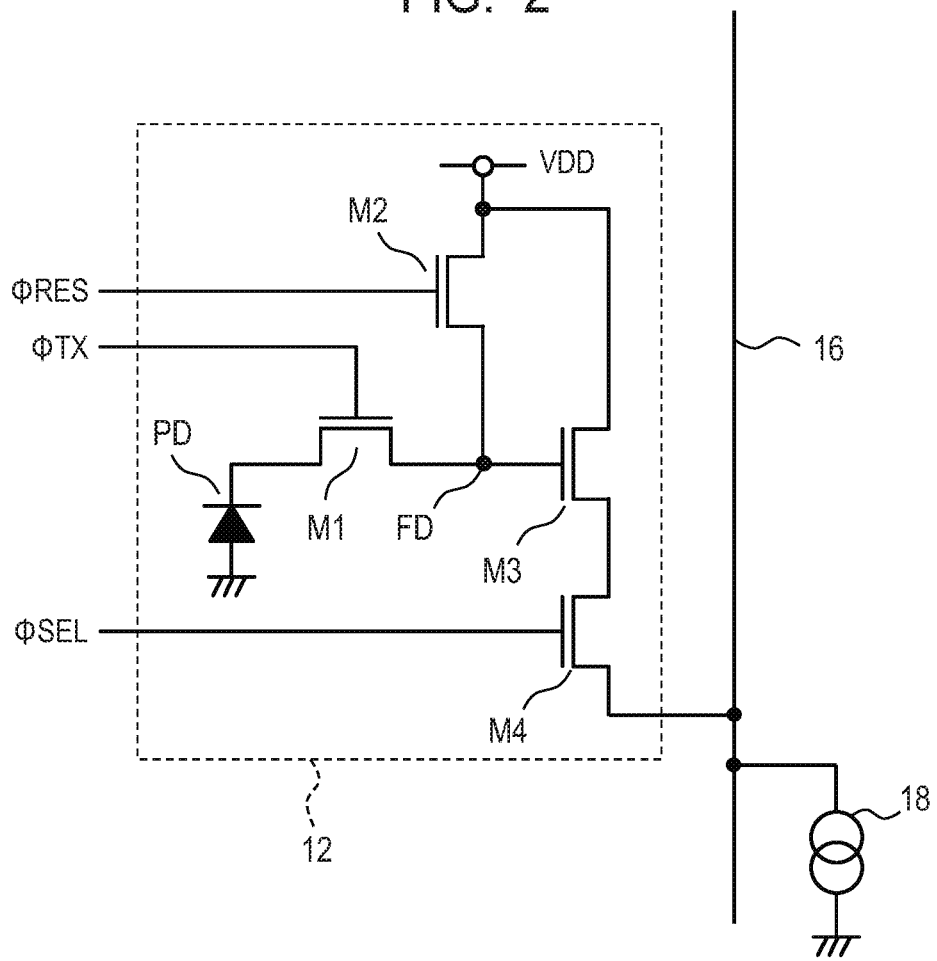
FIG. 2 is a circuit diagram illustrating a configuration example of a pixel in the photoelectric conversion device according to the first embodiment of the present invention.
Figure 3:
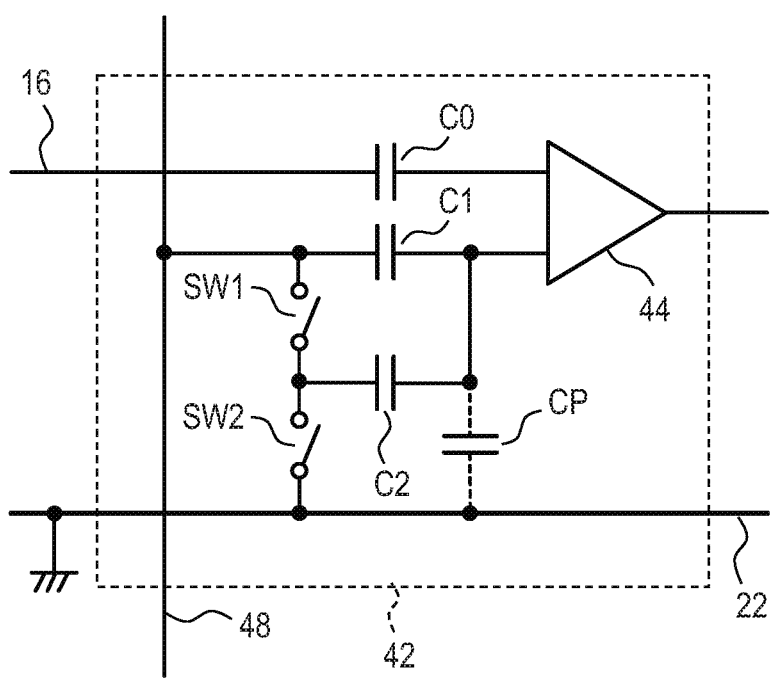
FIG. 3 is a circuit diagram illustrating a configuration example of a comparator unit in the photoelectric conversion device according to the first embodiment of the present invention.

First, a general configuration of the photoelectric conversion device according to the present embodiment will be described with reference to FIG. 1 to FIG. 3. FIG. 1 is a block diagram illustrating a general configuration of the photoelectric conversion device according to the present embodiment. FIG. 2 is a circuit diagram illustrating a configuration example of a pixel in the photoelectric conversion device according to the present embodiment. FIG. 3 is a circuit diagram illustrating a configuration example of a comparator unit in the photoelectric conversion device according to the present embodiment.

As illustrated in FIG. 1, a photoelectric conversion device 100 according to the present embodiment includes a pixel unit 10, a vertical scanning circuit 30, a comparator circuit 40, a reference signal generation circuit 46, a storage circuit 50, a counter circuit 58, a horizontal scanning circuit 60, a signal processing circuit 70, and a control circuit 80.

In the pixel unit 10, a plurality of pixels 12 arranged in a matrix to form a plurality of rows and a plurality of columns are provided. Each of the pixels 12 includes a photoelectric converter formed of a photoelectric conversion element such as a photodiode and outputs a pixel signal in accordance with a light amount of incident light. The number of rows and the number of columns of a pixel array arranged in the pixel unit 10 are not particularly limited. Further, in the pixel unit 10, an optical black pixel in which a photoelectric converter is shielded from light, a dummy pixel that outputs no signal, or the like may be arranged in addition to effective pixels that output pixel signals in accordance with a light amount of incident light.

On each row of the pixel array of the pixel unit 10, a control line 14 is arranged extending in a first direction (the horizontal direction in FIG. 1). Each control line 14 is connected to the pixels 12 aligned in the first direction, respectively, to form a signal line common to these pixels 12. The first direction in which the control line 14 extends may be referred to as a row direction or a horizontal direction. The control lines 14 are connected to the vertical scanning circuit 30.

On each column of the pixel array of the pixel unit 10, an output line 16 is arranged extending in a second direction (the vertical direction in FIG. 1) intersecting the first direction. Each output line 16 is connected to the pixels 12 aligned in the second direction, respectively, to form a signal line common to these pixels 12. The second direction in which the output line 16 extends may be referred to as a column direction or a vertical direction. The output lines 16 are connected to the comparator circuit 40.

The vertical scanning circuit 30 is a control circuit unit that supplies control signals, which are used for driving readout circuits within the pixels 12 when signals are read out from the pixels 12, to the pixels 12 via the control lines 14 provided on respective rows of the pixel array. The vertical scanning circuit 30 can be formed of a shift register or an address decoder. The vertical scanning circuit 30 drives the pixels 12 of the pixel unit 10 on a row basis by using control signals supplied via the control lines 14. The signals read out from the pixels 12 on a row basis are input to the comparator circuit 40 via the output lines 16 provided on respective columns of the pixel array.

The comparator circuit 40 includes a plurality of comparator units 42 provided to respective columns of the pixel array of the pixel unit 10. The comparator unit 42 on each column compares the level of a pixel signal read out from the pixel 12 on the corresponding column via the output line 16 with the level of a reference signal output from the reference signal generation circuit 46 and outputs a signal in accordance with a result of the comparison to the storage circuit 50. Specifically, the comparator unit 42 compares the level of a pixel signal with the level of the reference signal and, when the relationship of these signals is inverted, causes the output signal to transition from a high level to a low level or a low level to a high level.

The reference signal generation circuit 46 is connected to the comparator units 42 on respective columns via a reference signal line 48. The reference signal generation circuit 46 outputs a reference signal having a predetermined amplitude to the comparator units 42 on respective columns via the reference signal line 48. The reference signal line 48 transmits the reference signal output from the reference signal generation circuit 46. The reference signal may be a signal whose signal level (the level of the signal) changes with a lapse of time, for example. Typically, the reference signal is a ramp signal. A ramp signal is a signal whose signal level changes monotonically with a lapse of time, and the output voltage monotonically decreases or otherwise monotonically increases with a lapse of time, for example.

The storage circuit 50 includes a plurality of storage units 52 provided to respective columns of the pixel array of the pixel unit 10. The storage unit 52 on each column stores, as digital data, a count value indicated by a count signal that is being output from the counter circuit 58 at a timing of inversion of the signal level of an output signal of the comparator unit 42 on a corresponding column. The digital data stored in the storage unit 52 on each column may include two types of data, namely, a reference signal N and an effective signal S of a pixel signal.

The counter circuit 58 is connected to the storage unit 52 on each column. The counter circuit 58 starts a count operation in synchronization with a timing of start of a change in the signal level of the reference signal output from the reference signal generation circuit 46 and outputs a count signal indicating the count value to the storage unit 52 on each column.

In such a way, the comparator circuit 40 and the storage circuit 50 form an AD converter circuit that performs analog-to-digital conversion on a pixel signal output from the pixel 12 from an analog signal to a digital signal.

The horizontal scanning circuit 60 is a circuit unit that supplies, to the storage circuit 50, control signals used for transferring digital data stored in the storage circuit 50 to the signal processing circuit 70 sequentially on a column basis. The horizontal scanning circuit 60 can be formed of a shift register or an address decoder.

The signal processing circuit 70 is a circuit unit that is formed of a buffer amplifier, a differential amplifier, or the like and performs predetermined signal processing on a signal of a column selected by the horizontal scanning circuit 60. The signal processing performed by the signal processing circuit 70 may be an amplification process, a digital correlated double sampling (CDS) process, or the like. The digital CDS process is signal processing to perform a differential process of (S−N) when the storage circuit 50 stores two types of digital data, namely, the reference signal N and the effective signal S as a pixel signal.

The control circuit 80 is a circuit unit that supplies, to the vertical scanning circuit 30, the comparator circuit 40, the reference signal generation circuit 46, the storage circuit 50, the counter circuit 58, and the horizontal scanning circuit 60, control signals to control the operation or the timing of these circuits. Some or all of the control signals supplied to the vertical scanning circuit 30, the comparator circuit 40, the reference signal generation circuit 46, the storage circuit 50, the counter circuit 58, and the horizontal scanning circuit 60 may be supplied from the outside of the photoelectric conversion device 100.

As illustrated in FIG. 2, for example, each of the plurality of pixels 12 forming the pixel unit 10 may be formed of a photoelectric converter PD, a transfer transistor M1, a reset transistor M2, an amplifier transistor M3, and a select transistor M4.

The photoelectric converter PD is a photodiode, for example, the anode is connected to the ground node, and the cathode is connected to the source of the transfer transistor M1. The drain of the transfer transistor M1 is connected to the source of the reset transistor M2 and the gate of the amplifier transistor M3. The connection node of the drain of the transfer transistor M1, the source of the reset transistor M2, and the gate of the amplifier transistor M3 is a so-called floating diffusion portion FD. The floating diffusion portion FD includes a capacitance component (floating diffusion capacitance) and has a function as a charge holding unit.

The drain of the reset transistor M2 and the drain of the amplifier transistor M3 are connected to a power source node supplied with a voltage VDD. The source of the amplifier transistor M3 is connected to the drain of the select transistor M4. The source of the select transistor M4 is connected to the output line 16. The output line 16 is connected to a current source 18.

In the case of the pixel configuration illustrated in FIG. 2, the control line 14 on each row arranged in the pixel unit 10 includes a transfer gate signal line, a reset signal line, and a select signal line. The transfer gate signal line is connected to the gate of the transfer transistor M1 of the pixels 12 belonging to a corresponding row. The reset signal line is connected to the gate of the reset transistor M2 of the pixels 12 belonging to a corresponding row. The select signal line is connected to the gate of the select transistor M4 of the pixels 12 belonging to a corresponding row.

A control signal ΦTX used for controlling the transfer transistor M1 is output to the transfer gate signal line from the vertical scanning circuit 30. A control signal ΦRES used for controlling the reset transistor M2 is output to the reset signal line from the vertical scanning circuit 30. A control signal ΦSEL used for controlling the select transistor M4 is output to the select signal line from the vertical scanning circuit 30. The common control signal is supplied to the pixels 12 on the same row from the vertical scanning circuit 30. When each transistor is formed of an n-channel transistor, the corresponding transistor is turned on when a high-level control signal is supplied from the vertical scanning circuit 30, and the corresponding transistor is turned off when a low-level control signal is supplied from the vertical scanning circuit 30.

The photoelectric converter PD converts (photoelectrically converts) incident light into an amount of charges in accordance with the light amount and accumulates generated charges. When turned on, the transfer transistor M1 transfers charges held in the photoelectric converter PD to the floating diffusion portion FD. The voltage of the floating diffusion portion FD becomes a voltage in accordance with the amount of charges transferred from the photoelectric converter PD due to charge-to-voltage conversion caused by the capacitance of the floating diffusion portion FD. The amplifier transistor M3 is configured such that the voltage VDD is supplied to the drain and a bias current is supplied to the source from the current source 18 via the select transistor M4 and forms an amplifier unit (source follower circuit) whose gate is the input node. This causes the amplifier transistor M3 to output a signal in accordance with the voltage of the floating diffusion portion FD to the output line 16 via the select transistor M4. When turned on, the reset transistor M2 resets the floating diffusion portion FD to a voltage in accordance with the voltage VDD.

As illustrated in FIG. 3, for example, the comparator unit 42 on each column of the comparator circuit 40 may be formed of a differential input type comparator 44, capacitors C0, C1, and C2, and switches SW1 and SW2.

The comparator 44 has two input nodes and one output node. One input node of the comparator 44 is connected to one electrode of the capacitor C0. The other electrode of the capacitor C0 is connected to the output line 16 on a corresponding column. That is, one input node of the comparator 44 is connected to the output line 16 on a corresponding column via the capacitor C0. The other input node of the comparator 44 is connected to one electrode of the capacitor C1 and one electrode of the capacitor C2. The other electrode of the capacitor C1 is connected to the reference signal line 48. That is, the other input node of the comparator 44 is connected to the reference signal line 48 via the capacitor C1. The other electrode of the capacitor C2 is connected to the connection node between the reference signal line 48 and the capacitor C1 via the switch SW1 and is connected to a ground line 22 via the switch SW2. The control nodes of the switches SW1 and SW2 are connected to the control circuit 80. The output terminal of the comparator 44 is connected to the storage unit 52 on a corresponding column.

Further, there is a parasitic capacitance between the other input node of the comparator 44 and the ground line 22. This parasitic capacitance is denoted as a capacitance CP in FIG. 3. Note that, although there may be a parasitic capacitance also around another node such as the one input node of the comparator 44, the depiction or the like thereof will be omitted here for simplified illustration.

The ground line 22 is not particularly limited as long as it is an interconnection connected to the ground node but may be common to the pixel ground line provided in the pixel unit 10, may be common to a peripheral ground line provided to the comparator unit 42, or may be another separate ground line. Note that, in the present embodiment, the ground line is an interconnection connected to an external ground potential via an external ground terminal. The ground line 22 is one example of the reference voltage line and may be supplied with a potential used as a reference in the circuit without being limited to the ground potential.

The capacitors C0, C1, and C2 are not particularly limited, and each may be formed of a capacitor element such as a diffusion layer capacitor, a MIM capacitor, a MOS capacitor, or the like, for example. Each of the switches SW1 and SW2 may be formed of a MOS transistor, for example.

The switch SW1 has a connection state (conductive state/nonconductive state) controlled by a control signal from the control circuit 80 and switches the capacitor element (input capacitor) connected between the reference signal line 48 and the other input node of the comparator 44. Further, the switch SW2 has a connection state (conductive state/nonconductive state) controlled by a control signal from the control circuit 80 and switches the capacitor element connected between the other input node of the comparator 44 and the ground line 22. That is, the switches SW1 and SW2 form a switch circuit that switches the node to which the other electrode of the capacitor C2 is connected. This switch circuit forms a select unit that connects the other electrode of the capacitor C2 selectively to one of the reference signal generation circuit 46 and the ground node.

Accordingly, the amplitude of the reference signal supplied from the reference signal generation circuit 46 changes in accordance with capacitance division by the capacitance formed between the reference signal line 48 and the other node of the comparator 44 and the capacitance formed between the other node of the comparator 44 and the ground line 22. That is, the capacitors C1 and C2 and the switches SW1 and SW2 form an amplitude conversion circuit used for changing the amplitude of the reference signal supplied from the reference signal generation circuit 46. Thereby, the reference signal supplied from the reference signal generation circuit 46 is controlled to have a predetermined amplitude by such an amplitude conversion circuit and then input to the comparator 44.

The amplitude of the reference signal input from the reference signal line 48 to the comparator 44 via the reference signal amplitude circuit can be expressed as Equation (1) or Equation (2) below, for example. Herein, the amplitude VRMP is the amplitude of the reference signal output from the reference signal generation circuit 46. The amplitude RMPA is an amplitude of the reference signal input to the comparator 44 when the switch SW1 is in the on-state and the switch SW2 is in the off-state. The amplitude RMPB is an amplitude of the reference signal input to the comparator 44 when the switch SW1 is in the off-state and the switch SW2 is in the on-state. Note that, in Equation (1) and Equation (2), the variables C1, C2, and CP denote the capacitances of the capacitors C1, C2, and CP, respectively.

$$RMPA = VRMP \times (C1+C2)/(C1+C2+CP) \quad (1)$$

$$RMPB = VRMP \times C1/(C1+C2+CP) \quad (2)$$

Figure 4:
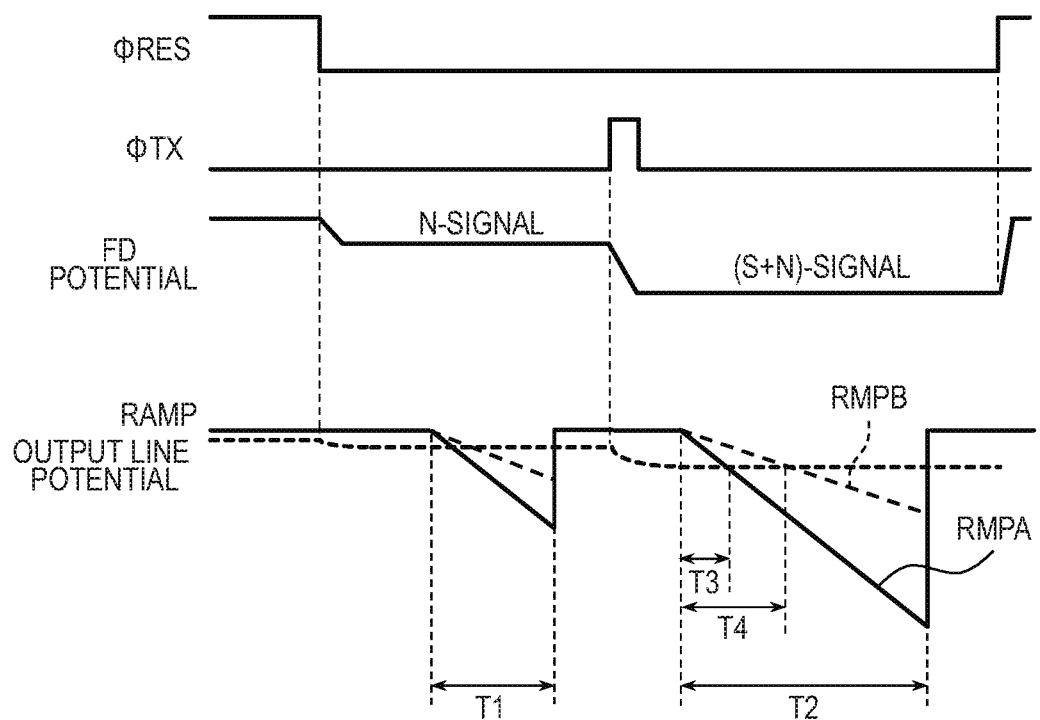
FIG. 4 is a timing chart illustrating the operation of the photoelectric conversion device according to the first embodiment of the present invention.

Next, the operation of the photoelectric conversion device according to the present embodiment will be described with reference to FIG. 4. FIG. 4 is a timing chart illustrating the operation of the photoelectric conversion device according to the present embodiment. FIG. 4 illustrates the operation of the pixel 12 and the operation of the comparator circuit 40 for one row out of the plurality of pixel rows forming the pixel unit 10. Note that, although not depicted in FIG. 4, it is assumed that the control signal ΦSEL corresponding to a row from which a pixel signal is read out is maintained at the high level during the depicted period.

First, the control signal ORES supplied to the control line 14 on a pixel row on which readout is performed is controlled from the high level to the low level by the vertical scanning circuit 30, and the reset transistor M2 of the pixel 12 belonging to the pixel row is turned off. Thereby, the potential of the floating diffusion portion FD becomes a reset potential in accordance with the voltage VDD, and a reset signal in accordance with the reset potential (hereafter, referred to as "N-signal") is output to the output line 16.

In the subsequent period T1, a first AD conversion process is performed on the N-signal output to the output line 16. The comparator 44 compares the level of the N-signal and the level of the ramp signal RAMP and, when the relationship of the ramp signal RAMP and the N-signal is inverted, causes the output to transition from a high level to a low level or otherwise a low level to a high level. The counter circuit 58 starts counting from the start of a change in the signal level of the ramp signal RAMP (the start of the period T1) and outputs a count signal in accordance with the count value to the storage unit 52. The storage unit 52 stores, as first digital data, the count value of the count signal that is being output from the counter circuit 58 at a timing of inversion of the output of the comparator 44.

After completion of the first AD conversion process, the control signal ΦTX supplied to the control line 14 on a pixel row on which readout is performed is controlled from the low level to the high level by the vertical scanning circuit 30, and the transfer transistor M1 of the pixel 12 belonging to the pixel row is turned on. Thereby, charges accumulated in the photoelectric converter PD are transferred to the floating diffusion portion FD, and the potential of the output line 16 changes to a potential in accordance with the amount of charges transferred from the photoelectric converter PD to the floating diffusion portion FD. At this time, a signal corresponding to the sum of the N-signal and a signal in accordance with the amount of charges generated in the photoelectric converter PD appears on the output line 16. Hereafter, this signal is referred to as "(S+N)-signal".

In the subsequent period T2, a second AD conversion process is performed on the (S+N)-signal output to the output line. The comparator 44 compares the level of the (S+N)-signal and the level of the ramp signal RAMP and, when the relationship of the ramp signal RAMP and the (S+N)-signal is inverted, causes the output to transition from the high level to the low level or otherwise the low level to the high level. The counter circuit 58 starts counting from the start of a change in the signal level of the ramp signal RAMP (the start of the period T2) and outputs a count signal in accordance with the count value to the storage unit 52. The storage unit 52 stores, as second digital data, the count value of the count signal that is being output from the counter circuit 58 at a timing of inversion of the output of the comparator 44.

After completion of the second AD conversion process, the control signal ORES supplied to the control line 14 on a pixel row on which readout is performed is controlled from the low level to the high level by the vertical scanning circuit 30, and the reset transistor M2 of the pixel 12 belonging to the pixel row is turned on. Thereby, the potential of the floating diffusion portion FD becomes a potential in accordance with the voltage VDD, and the gate node of the amplifier transistor M3 is in a reset state.

The first digital data and the second digital data stored in the storage unit 52 on each column are transferred to the signal processing circuit 70 subsequently on a column basis in accordance with the control signal from the horizontal scanning circuit 60. In the signal processing circuit 70, a differential process to subtract the value represented by the first digital data from the value represented by the second digital data is performed, and the characteristic variation among the comparator units 42 on respective columns is removed. Note that signal processing including a differential process may be performed by a signal processing device outside the photoelectric conversion device 100 without the differential process being performed in the signal processing circuit 70.

The amplitude (slope) of the ramp signal RAMP can be changed by appropriately controlling the switches SW1 and SW2 of the comparator unit 42 as described above. By changing the amplitude (slope) of the ramp signal RAMP input to the comparator 44, it is possible to switch the AD conversion gain.

That is, when the switch SW1 is in the on-state and the switch SW2 is in the off-state, the amplitude of the ramp signal RAMP is the amplitude RMPA expressed by Equation (1) described above. The amplitude RMPA is $((C1+C2)/(C1+C2+CP))$ times the amplitude VRMP of the ramp signal output from the reference signal generation circuit 46. At this time, the period from the start of the second AD conversion process to the inversion of the relationship between the ramp signal RAMP and the (S+N)-signal is a period T3. The value of the second digital data obtained when the ramp signal RAMP with the amplitude RMPA is used is $((C1+C2+CP)/(C1+C2))$ times the value of the second digital data obtained when the ramp signal RAMP with the amplitude VRMP is used. At this time, the degree of noise superimposed on the ramp signal input to the comparator 44 changes in the same manner as the slope of the ramp signal and is $((C1+C2)/(C1+C2+CP))$-fold.

When the switch SW1 is in the off-state and the switch SW2 is in the on-state, the amplitude of the ramp signal RAMP is the amplitude RMPB expressed by Equation (2) described above. The amplitude RMPB is $(C1/(C1+C2+CP))$ times the amplitude VRMP of the ramp signal output from the reference signal generation circuit 46. At this time, the period from the start of the second AD conversion process to the inversion of the relationship between the ramp signal RAMP and the (S+N)-signal is a period T4. The value of the second digital data obtained when the ramp signal RAMP with the amplitude RMPB is used is $((C1+C2+CP)/C1)$ times the value of the second digital data obtained when the ramp signal RAMP with the amplitude VRMP is used. At this time, the degree of noise superimposed on the ramp signal input to the comparator 44 changes in the same manner as the slope of the ramp signal and is (C1/(C1+C2+CP))-fold.

When a plurality of ramp signals are used in an AD conversion circuit, accuracy of an individual ramp signal and relative accuracy between ramp signals significantly affect an AD conversion error. For example, when the amplitude of a ramp signal is changed at and output from a ramp signal source, since noise occurring in an output buffer stage of the ramp signal source does not depend on the amplitude of the ramp signal, noise superimposed on the ramp signal is constant even when the amplitudes of ramp signals differ on a pixel row basis. As a result, large horizontal stripe noise may be detected on a pixel row basis.

In this regard, in the photoelectric conversion device of the present embodiment, the degree of noise superimposed on the ramp signal RAMP input to the comparator 44 changes in the same manner as the amplitude (slope) of the ramp signal RAMP. For example, when the amplitude (slope) of the ramp signal RAMP changes to 1-fold, ½-fold, and ¼-fold, the noise superimposed on the ramp signal RAMP will also be 1-fold, ½-fold, and ¼-fold. Therefore, according to the photoelectric conversion device of the present embodiment, it is possible to suppress occurrence of horizontal stripe noise due to noise superimposed on the ramp signal RAMP.

Figure 7:
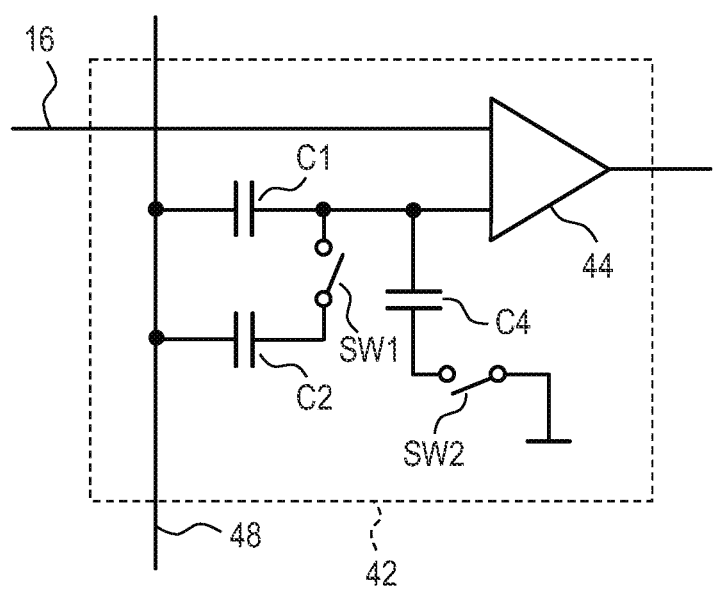
FIG. 7 is a circuit diagram illustrating a configuration example of a comparator unit in a photoelectric conversion device according to a reference example.

Further, substantially the same function as that of the comparator unit 42 in the photoelectric conversion device of the present embodiment can be realized by a circuit configuration illustrated in FIG. 7, for example. In the comparator unit 42 illustrated in FIG. 7, the amplitude conversion circuit is formed of three capacitors C1, C2, and C4 and two switches SW1 and SW2.

One input node of the comparator 44 is connected to the output line 16. The other input node of the comparator 44 is connected to one electrode of the capacitor C1 and one electrode of the capacitor C4. Further, the other input node of the comparator 44 is connected to one electrode of the capacitor C2 via the switch SW1. The other electrode of the capacitor C1 and the other electrode of the capacitor C2 are connected to the reference signal line 48 supplied with the reference signal. The other electrode of the capacitor C4 is connected to the ground node via the switch SW2. Further, although not depicted in FIG. 7, there is a parasitic capacitance (capacitance CP) that is the same as the case of the comparator unit 42 of the present embodiment illustrated in FIG. 3 between the other input node of the comparator 44 and the ground node.

In the circuit of FIG. 7, when the switch SW1 is in the on-state and the switch SW2 is in the off-state, the amplitude of the ramp signal input to the comparator 44 is ((C1+C2)/(C1+C2+CP)) times the amplitude VRMP. This relationship is equal to the relationship of Equation (1) described above. Further, when the switch SW1 is in the off-state and the switch SW2 is in the on-state, the amplitude of the ramp signal input to the comparator 44 is (C1/(C1+C4+CP)) times the amplitude VRMP. When the capacitance of the capacitor C2 and the capacitance of the capacitor C4 are the same, the amplitude of the ramp signal input to the comparator 44 is (C1/(C1+C2+CP)) times the amplitude VRMP. This relationship is equal to the relationship of Equation (2) described above.

However, addition of the capacitor C4 to form the amplitude conversion circuit will increase the number of the capacitor elements and increase the circuit area of the comparator unit 42. In particular, in the photoelectric conversion device in which the comparator circuit 40 includes the plurality of comparator units 42 for respective columns of the pixel unit 10, the above situation is not preferable because an increase in the area of the comparator unit 42 significantly affects the pixel pitch, an increase in the chip size, or the like. It appears to be useful to reduce the size (capacitance) of each capacitor in order to suppress an increase in the area of the comparator unit 42, but in such a case, the parasitic capacitance will significantly affect the input capacitance in particular when a low AD conversion gain is set, and variation will occur in the AD conversion gains on respective columns. As a result, vertical stripe noise may occur in an acquired image.

In this regard, in the photoelectric conversion device of the present embodiment, the amplitude conversion circuit of the comparator unit 42 is formed of the two capacitors C1 and C2 and the two switches SW1 and SW2. The input capacitance when an AD conversion gain corresponding to Equation (1) described above is set to be low is a combined capacitance (C1+C2) resulted from the capacitor C1 and the capacitor C2. Since the comparator unit 42 does not include any other capacitor element than the capacitors C1, C2, and CP on the other input node side of the comparator 44, the circuit area of the comparator unit 42 is substantially the same as the circuit area of the comparator unit which has the same input capacitors but has no amplitude conversion circuit. Therefore, even when the AD conversion gain is low, variation of AD conversion gains on respective columns when the parasitic capacitances (capacitances CP) that are continuous in the comparators 44 vary for respective columns can be reduced to the substantially the same level as that of the comparator units having the same area that do not form the amplitude conversion circuit.

As described above, according to the present embodiment, it is possible to reduce vertical stripe noise while suppressing horizontal stripe noise due to a reference signal generation circuit.

Second Embodiment

A photoelectric conversion device and a method of driving the same according to a second embodiment of the present invention will be described with reference to FIG. 5 and FIG. 6. The same components as those in the photoelectric conversion device according to the first embodiment are labeled with the same references, and the description thereof will be omitted or simplified.

Figure 5:
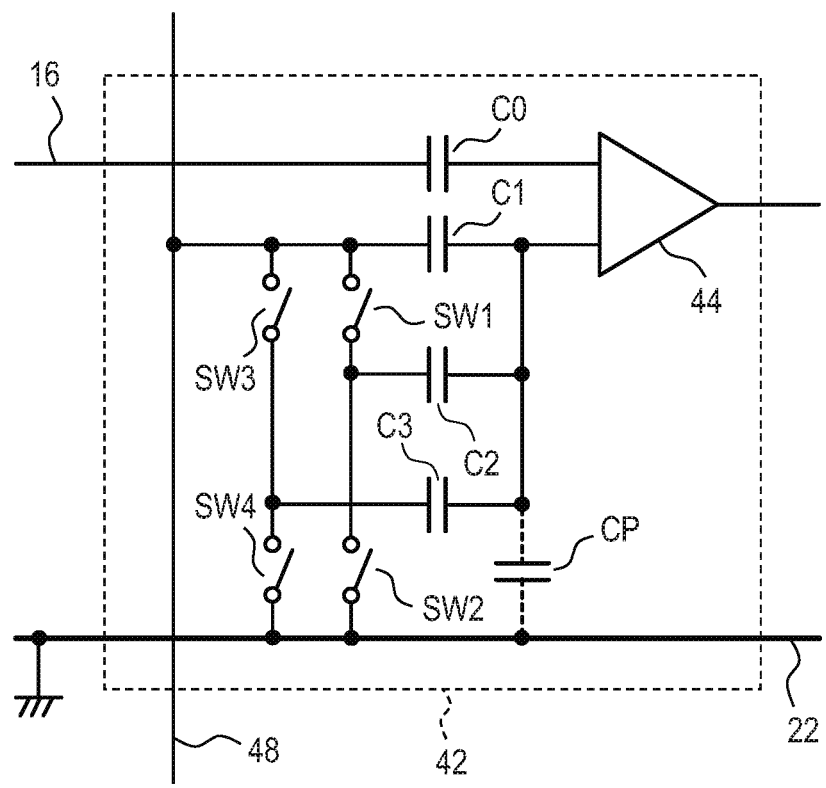
FIG. 5 is a circuit diagram illustrating a configuration example of a comparator unit in a photoelectric conversion device according to a second embodiment of the present invention.
Figure 6:
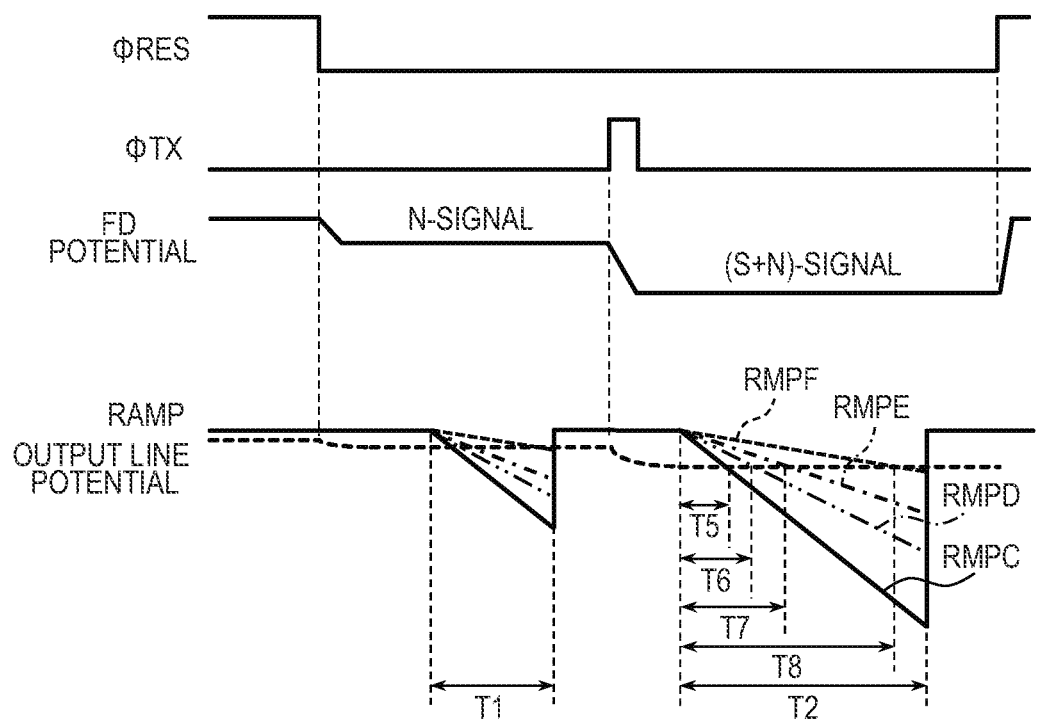
FIG. 6 is a timing chart illustrating the operation of the photoelectric conversion device according to the second embodiment of the present invention.

FIG. 5 is a circuit diagram illustrating a configuration example of the comparator unit in the photoelectric conversion device according to the present embodiment. FIG. 6 is a timing chart illustrating the operation of the photoelectric conversion device according to the present embodiment.

The photoelectric conversion device according to the present embodiment has the same overall configuration as the photoelectric conversion device according to the first embodiment except for the configuration of the comparator unit 42 on each column forming the comparator circuit 40.

As illustrated in FIG. 5, the comparator unit 42 in the photoelectric conversion device according to the present embodiment further includes a capacitor C3 and switches SW3 and SW4. One electrode of the capacitor C3 is connected to the other input node of the comparator 44. The other electrode of the capacitor C3 is connected to the connection node between the reference signal line 48 and the capacitor C1 via the switch SW3 and connected to the ground line 22 via the switch SW4. The control nodes of the switches SW3 and SW4 are connected to the control circuit

80. The connection relationship among other circuit elements is the same as that of the comparator unit 42 of FIG. 3.

The switches SW1 and SW3 have a connection state (conductive state/nonconductive state) controlled by a control signal from the control circuit 80 and switch the capacitor element (input capacitance) connected between the reference signal line 48 and the other input node of the comparator 44. Further, the switches SW2 and SW4 have a connection state (conductive state/nonconductive state) controlled by a control signal from the control circuit 80 and switch the capacitor element connected between the other input node of the comparator 44 and the ground line 22. That is, the switches SW3 and SW4 form a switch circuit that switches the node to which the other electrode of the capacitor C3 is connected. The other electrode of the capacitor C3 is configured to be able to be connected to either one of the reference signal generation circuit 46 and the ground node by this switch circuit.

Accordingly, the amplitude of the reference signal supplied from the reference signal generation circuit 46 changes in accordance with capacitance division by the capacitance formed between the reference signal line 48 and the other node of the comparator 44 and the capacitance formed between the other node of the comparator 44 and the ground line 22. That is, the capacitors C1, C2, and C3 and the switches SW1, SW2, SW3, and SW4 form an amplitude conversion circuit used for changing the amplitude of the reference signal supplied from the reference signal generation circuit 46. Thereby, the reference signal supplied from the reference signal generation circuit 46 is controlled to have a predetermined amplitude by this amplitude conversion circuit and then input to the comparator 44.

The amplitude of the reference signal input from the reference signal line 48 to the comparator 44 via the reference signal amplitude circuit can be expressed as Equation (3) to Equation (6) below, for example. Herein, the amplitude VRMP is the amplitude of the reference signal output from the reference signal generation circuit 46. The amplitude RMPC is the amplitude of a reference signal input to the comparator 44 when the switches SW1 and SW3 are in the on-state and the switches SW2 and SW4 are in the off-state. The amplitude RMPD is the amplitude of a reference signal input to the comparator 44 when the switches SW1 and SW4 are in the off-state and the switches SW2 and SW3 are in the on-state. The amplitude RMPE is the amplitude of a reference signal input to the comparator 44 when the switches SW1 and SW4 are in the on-state and the switches SW2 and SW3 are in the off-state. The amplitude RMPF is the amplitude of a reference signal input to the comparator 44 when the switches SW1 and SW3 are in the off-state and the switches SW2 and SW4 are in the on-state. Note that, in Equation (3) to Equation (6), the variables C1, C2, C3, and CP denote the capacitances of the capacitors C1, C2, C3, and CP, respectively.

$$RMPC = VRMP \times (C1+C2+C3)/(C1+C2+C3+CP) \quad (3)$$

$$RMPD = VRMP \times (C1+C3)/(C1+C2+C3+CP) \quad (4)$$

$$RMPE = VRMP \times (C1+C2)/(C1+C2+C3+CP) \quad (5)$$

$$RMPF = VRMP \times C1/(C1+C2+C3+CP) \quad (6)$$

Next, the operation of the photoelectric conversion device according to the present embodiment will be described with reference to FIG. 6. FIG. 6 illustrates the operation of the pixel 12 and the operation of the comparator circuit 40 for one row out of the plurality of pixel rows forming the pixel unit 10. Note that, although not depicted in FIG. 6, it is assumed that the control signal ΦSEL corresponding to a row from which a pixel signal is read out is maintained at the high level during the depicted period.

First, the control signal ORES supplied to the control line 14 on a pixel row on which readout is performed is controlled from the high level to the low level by the vertical scanning circuit 30, and the reset transistor M2 of the pixel 12 belonging to the pixel row is turned off. Thereby, the potential of the floating diffusion portion FD becomes a reset potential in accordance with the voltage VDD, and a reset signal in accordance with the reset potential (N-signal) is output to the output line 16.

In the subsequent period T1, the first AD conversion process is performed on the N-signal output to the output line 16. The comparator 44 compares the level of the N-signal and the level of the ramp signal RAMP and, when the relationship of the ramp signal RAMP and the N-signal is inverted, causes the output to transition from the high level to the low level or otherwise the low level to the high level. The counter circuit 58 starts counting from the start of a change in the signal level of the ramp signal RAMP (the start of the period T1) and outputs a count signal in accordance with the count value to the storage unit 52. The storage unit 52 stores, as first digital data, the count value of the count signal that is being output from the counter circuit 58 at a timing of inversion of the output of the comparator 44.

After completion of the first AD conversion process, the control signal ΦTX supplied to the control line 14 on a pixel row on which readout is performed is controlled from the low level to the high level by the vertical scanning circuit 30, and the transfer transistor M1 of the pixel 12 belonging to the pixel row is turned on. Thereby, charges accumulated in the photoelectric converter PD are transferred to the floating diffusion portion FD, and the potential of the output line 16 changes to a potential in accordance with the amount of charges transferred from the photoelectric converter PD to the floating diffusion portion FD. At this time, the signal ((S+N)-signal) corresponding to a sum of the N-signal and a signal in accordance with the amount of charges generated in the photoelectric converter PD appears on the output line 16.

In the subsequent period T2, the second AD conversion process is performed on the (S+N)-signal output to the output line. The comparator 44 compares the level of the (S+N)-signal and the level of the ramp signal RAMP and, when the relationship of the ramp signal RAMP and the (S+N)-signal is inverted, causes the output to transition from the high level to the low level or otherwise the low level to the high level. The counter circuit 58 starts counting from the start of a change in the signal level of the ramp signal RAMP (the start of the period T2) and outputs a count signal in accordance with the count value to the storage unit 52. The storage unit 52 stores, as second digital data, the count value of the count signal that is being output from the counter circuit 58 at a timing of inversion of the output of the comparator 44.

After completion of the second AD conversion process, the control signal ORES supplied to the control line 14 on a pixel row on which readout is performed is controlled from the low level to the high level by the vertical scanning circuit 30, and the reset transistor M2 of the pixel 12 belonging to the pixel row is turned on. Thereby, the potential of the floating diffusion portion FD becomes a potential in accordance with the voltage VDD, and the gate node of the amplifier transistor M3 is in a reset state.

The first digital data and the second digital data stored in the storage unit 52 on each column are transferred to the signal processing circuit 70 subsequently on a column basis in accordance with the control signal from the horizontal scanning circuit 60. In the signal processing circuit 70, a differential process to subtract the value represented by the first digital data from the value represented by the second digital data is performed, and the characteristic variation among the comparator units 42 on respective columns is removed. Note that signal processing including a differential process may be performed by a signal processing device outside the photoelectric conversion device 100 without the differential process being performed in the signal processing circuit 70.

The amplitude (slope) of the ramp signal RAMP can be changed by appropriately controlling the switches SW1, SW2, SW3, and SW4 of the comparator unit 42 as described above. By changing the amplitude (slope) of the ramp signal RAMP input to the comparator 44, it is possible to switch the AD conversion gain.

That is, when the switches SW1 and SW3 are in the on-state and the switches SW2 and SW4 are in the off-state, the amplitude of the ramp signal RAMP is the amplitude RMPC expressed by Equation (3) described above. The amplitude RMPC is ((C1+C2+C3)/(C1+C2+C3+CP)) times the amplitude VRMP of the ramp signal output from the reference signal generation circuit 46. At this time, the period from the start of the second AD conversion process to the inversion of the relationship between the ramp signal RAMP and the (S+N)-signal is a period T5. The value of the second digital data obtained when the ramp signal RAMP with the amplitude RMPC is used is ((C1+C2+C3+CP)/(C1+C2+C3)) times the value of the second digital data obtained when the ramp signal RAMP with the amplitude VRMP is used. At this time, the degree of noise superimposed on the ramp signal input to the comparator 44 changes in the same manner as the slope of the ramp signal and is ((C1+C2+C3)/(C1+C2+C3+CP))-fold. For example, when C1:C2:C3=1:1:2 and the capacitance CP is small enough to be ignored, the resulted AD conversion gain is 1-fold.

When the switches SW1 and SW4 are in the off-state and the switches SW2 and SW3 are in the on-state, the amplitude of the ramp signal RAMP is the amplitude RMPD expressed by Equation (4) described above. The amplitude RMPD is ((C1+C3)/(C1+C2+C3+CP)) times the amplitude VRMP of the ramp signal output from the reference signal generation circuit 46. At this time, the period from the start of the second AD conversion process to the inversion of the relationship between the ramp signal RAMP and the (S+N)-signal is a period T6. The value of the second digital data obtained when the ramp signal RAMP with the amplitude RMPD is used is ((C1+C2+C3+CP)/(C1+C3)) times the value of the second digital data obtained when the ramp signal RAMP with the amplitude VRMP is used. At this time, the degree of noise superimposed on the ramp signal input to the comparator 44 changes in the same manner as the slope of the ramp signal and is ((C1+C3)/(C1+C2+C3+CP))-fold. For example, when C1:C2:C3=1:1:2 and the capacitance CP is small enough to be ignored, the resulted AD conversion gain is 1.33-fold.

When the switches SW1 and SW4 are in the on-state and the switches SW2 and SW3 are in the off-state, the amplitude of the ramp signal RAMP is the amplitude RMPE expressed by Equation (5) described above. The amplitude RMPE is ((C1+C2)/(C1+C2+C3+CP)) times the amplitude VRMP of the ramp signal output from the reference signal generation circuit 46. At this time, the period from the start of the second AD conversion process to the inversion of the relationship between the ramp signal RAMP and the (S+N)-signal is a period T7. The value of the second digital data obtained when the ramp signal RAMP with the amplitude RMPE is used is ((C1+C2+C3+CP)/(C1+C2)) times the value of the second digital data obtained when the ramp signal RAMP with the amplitude VRMP is used. At this time, the degree of noise superimposed on the ramp signal input to the comparator 44 changes in the same manner as the slope of the ramp signal and is ((C1+C2)/(C1+C2+C3+CP))-fold. For example, when C1:C2:C3=1:1:2 and the capacitance CP is small enough to be ignored, the resulted AD conversion gain is 2-fold.

When the switches SW1 and SW3 are in the off-state and the switches SW2 and SW4 are in the on-state, the amplitude of the ramp signal RAMP is the amplitude RMPF expressed by Equation (6) described above. The amplitude RMPF is (C1/(C1+C2+C3+CP)) times the amplitude VRMP of the ramp signal output from the reference signal generation circuit 46. At this time, the period from the start of the second AD conversion process to the inversion of the relationship between the ramp signal RAMP and the (S+N)-signal is a period T8. The value of the second digital data obtained when the ramp signal RAMP with the amplitude RMPF is used is ((C1+C2+C3+CP)/C1) times the value of the second digital data obtained when the ramp signal RAMP with the amplitude VRMP is used. At this time, the degree of noise superimposed on the ramp signal input to the comparator 44 changes in the same manner as the slope of the ramp signal and is (C1/(C1+C2+C3+CP))-fold. For example, C1:C2:C3=1:1:2, and when the capacitance CP is small enough to be ignored, the resulted AD conversion gain is 4-fold.

Also in the photoelectric conversion device of the present embodiment, the degree of noise superimposed on the ramp signal RAMP input to the comparator 44 changes in the same manner as the amplitude (slope) of the ramp signal RAMP. For example, when the amplitude (slope) of the ramp signal RAMP changes to 1-fold, 1/1.33-fold, ½-fold, and ¼-fold, the noise superimposed on the ramp signal RAMP will also be 1-fold, 1/1.33-fold, ½-fold, and ¼-fold. Therefore, according to the photoelectric conversion device of the present embodiment, it is possible to suppress occurrence of horizontal stripe noise due to noise superimposed on the ramp signal RAMP.

Further, in the photoelectric conversion device of the present embodiment, the amplitude conversion circuit of the comparator unit 42 is formed of the three capacitors C1, C2, and C3 and the four switches SW1, SW2, SW3, and SW4. The input capacitance when an AD conversion gain corresponding to Equation (3) described above is set to be low is a combined capacitance (C1+C2+C3) resulted from the capacitor C1, the capacitor C2, and the capacitor C3. Since the comparator unit 42 does not include any other capacitor element than the capacitors C1, C2, C3, and CP on the other input node side of the comparator 44, the circuit area of the comparator unit 42 is substantially the same as the circuit area of the comparator unit which has the same input capacitors but has no amplitude conversion circuit. Therefore, even when the AD conversion gain is low, variation of AD conversion gains on respective columns when the parasitic capacitances (capacitances CP) that are continuous in the comparators 44 vary for respective columns can be reduced to substantially the same level as that of the comparator units having the same area that do not form the amplitude conversion circuit.

As described above, according to the present embodiment, it is possible to reduce vertical stripe noise while suppressing horizontal stripe noise due to a reference signal generation circuit.

Third Embodiment

Figure 8:
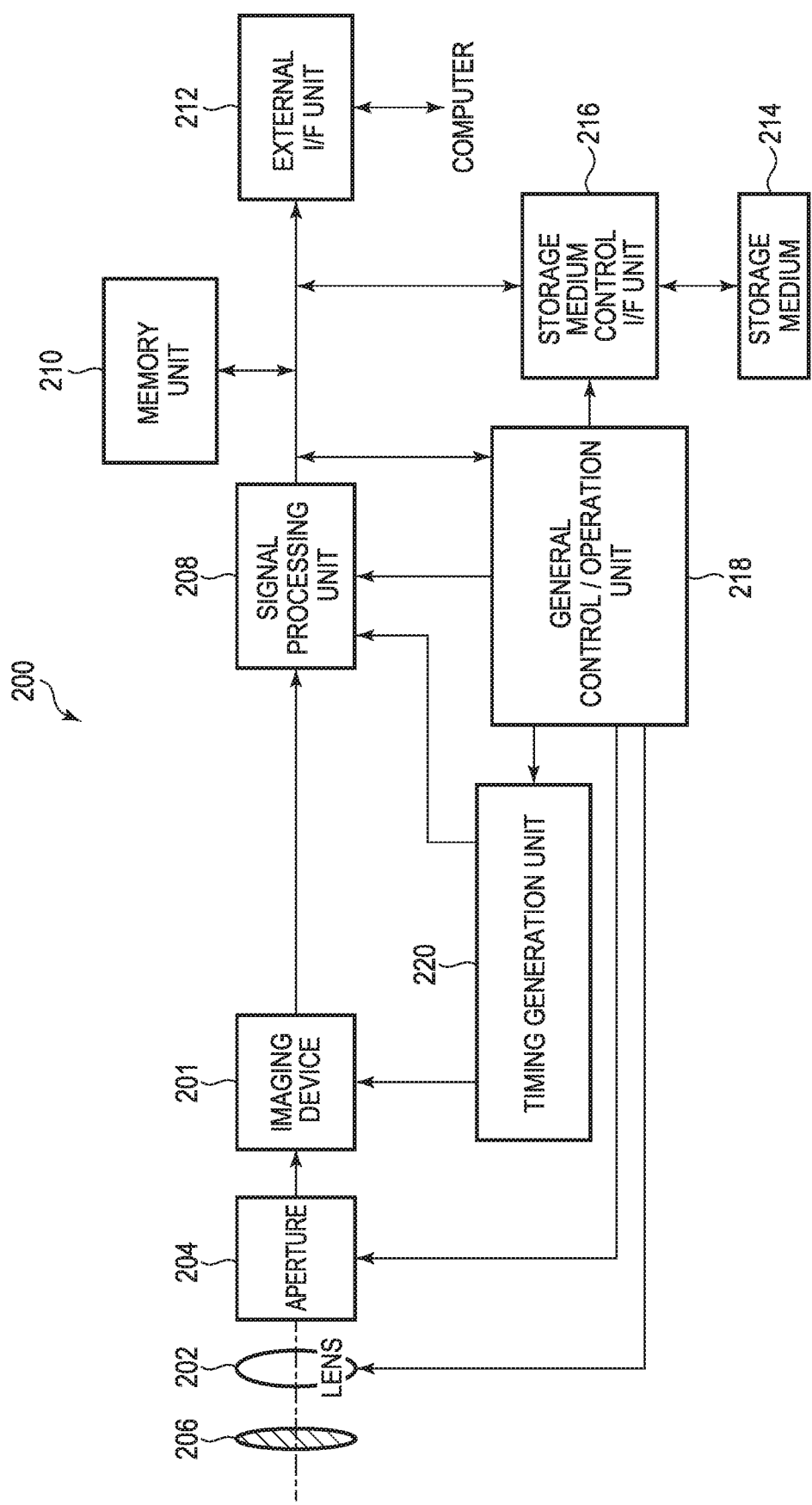
FIG. 8 is a block diagram illustrating a general configuration of an imaging system according to a third embodiment of the present invention.

An imaging system according to a third embodiment of the present invention will be described with reference to FIG. 8. FIG. 8 is a block diagram illustrating a general configuration of the imaging system according to the present embodiment.

The photoelectric conversion device 100 described in the first and second embodiments described above can be applied to various imaging systems. Examples of applicable imaging systems may include a digital still camera, a digital camcorder, a surveillance camera, a copying machine, a fax machine, a mobile phone, an on-vehicle camera, an observation satellite, and the like. In addition, a camera module including an optical system such as a lens and an imaging device is also included in the imaging system. FIG. 8 illustrates a block diagram of a digital still camera as an example out of these examples.

An imaging system 200 illustrated as an example in FIG. 8 includes an imaging device 201, a lens 202 that captures an optical image of an object onto the imaging device 201, an aperture 204 for changing a light amount passing through the lens 202, and a barrier 206 for protecting the lens 202. The lens 202 and the aperture 204 form an optical system that converges a light onto the imaging device 201. The imaging device 201 is the photoelectric conversion device 100 described in any of the first and second embodiments and converts an optical image captured by the lens 202 into image data.

Further, the imaging system 200 includes a signal processing unit 208 that processes an output signal output from the imaging device 201. The signal processing unit 208 performs AD conversion to convert an analog signal output from the imaging device 201 into a digital signal. In addition, the signal processing unit 208 performs operations of performing various correction or compression to output image data, if necessary. The AD conversion unit that is a part of the signal processing unit 208 may be formed on a semiconductor substrate on which the imaging device 201 is provided or formed on a semiconductor substrate separately from the imaging device 201. Further, the imaging device 201 and the signal processing unit 208 may be formed on the same semiconductor substrate.

Furthermore, the imaging system 200 includes a memory unit 210 for temporarily storing image data therein and an external interface unit (external I/F unit) 212 for communicating with an external computer or the like. The imaging system 200 further includes a storage medium 214 such as a semiconductor memory for performing storage or readout of imaging data and a storage medium control interface unit (storage medium control I/F unit) 216 for performing storage or readout on the storage medium 214. Note that the storage medium 214 may be embedded in the imaging system 200 or may be removable.

Furthermore, the imaging system 200 includes a general control/operation unit 218 that performs various calculation and controls the entire digital still camera and a timing generation unit 220 that outputs various timing signals to the imaging device 201 and the signal processing unit 208.

Here, the timing signal or the like may be input from the outside, and the imaging system 200 may have at least the imaging device 201 and the signal processing unit 208 that processes an output signal output from the imaging device 201.

The imaging device 201 outputs an imaging signal to the signal processing unit 208. The signal processing unit 208 performs predetermined signal processing on an imaging signal output from the imaging device 201 and outputs image data. The signal processing unit 208 uses an imaging signal to generate an image.

As described above, according to the present embodiment, the imaging system to which the photoelectric conversion device 100 according to the first or second embodiment is applied can be realized.

Fourth Embodiment

Figure 9A:
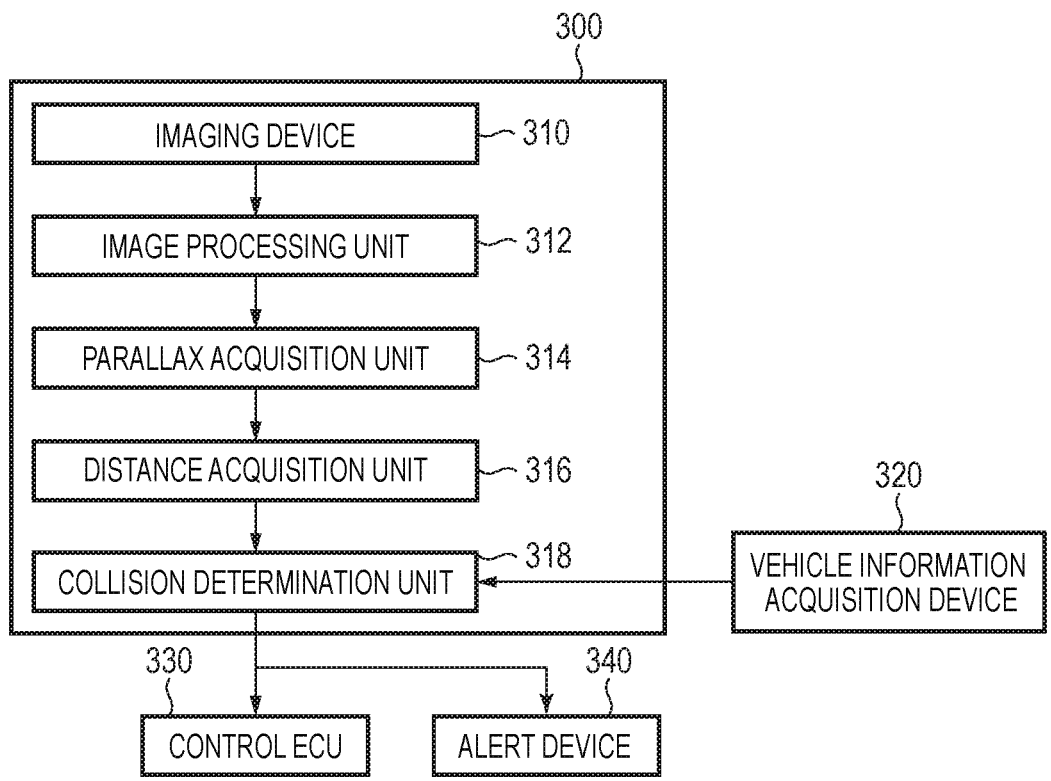
FIG. 9A is a diagram illustrating a configuration example of an imaging system according to a fourth embodiment of the present invention.
Figure 9B:
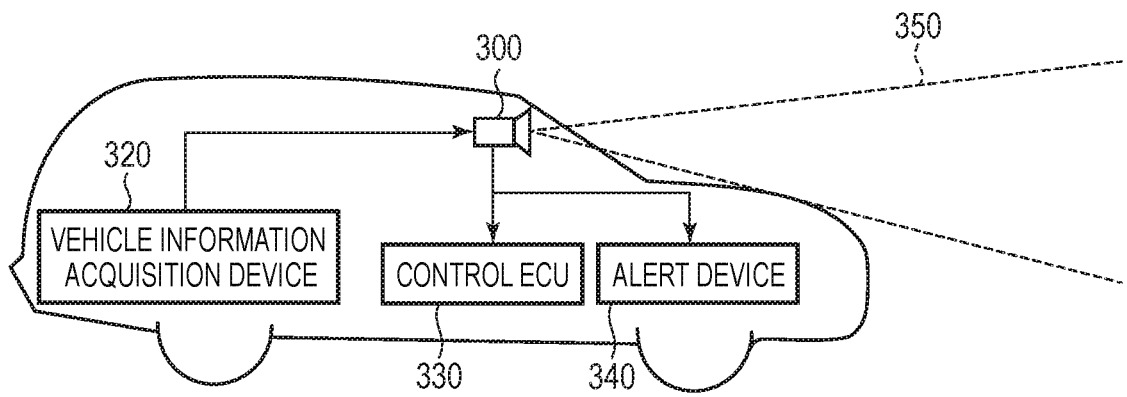
FIG. 9B is a diagram illustrating a configuration example of a movable object according to the fourth embodiment of the present invention.

An imaging system and a movable object according to a fourth embodiment of the present invention will be described with reference to FIG. 9A and FIG. 9B. FIG. 9A is a diagram illustrating a configuration of the imaging system according to the present embodiment. FIG. 9B is a diagram illustrating a configuration of the movable object according to the present embodiment.

FIG. 9A illustrates an example of an imaging system related to an on-vehicle camera. An imaging system 300 includes an imaging device 310. The imaging device 310 is the photoelectric conversion device 100 described in any of the above first and second embodiments. The imaging system 300 includes an image processing unit 312 that performs image processing on a plurality of image data acquired by the imaging device 310 and a parallax acquisition unit 314 that calculates a parallax (a phase difference of parallax images) from the plurality of image data acquired by the imaging system 300. Further, the imaging system 300 includes a distance acquisition unit 316 that calculates a distance to the object based on the calculated parallax and a collision determination unit 318 that determines whether or not there is a collision possibility based on the calculated distance. Here, the parallax acquisition unit 314 and the distance acquisition unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like or may be implemented by a combination thereof.

The imaging system 300 is connected to the vehicle information acquisition device 320 and can acquire vehicle information such as a vehicle speed, a yaw rate, a steering angle, or the like. Further, the imaging system 300 is connected to a control ECU 330, which is a control device that outputs a control signal for causing a vehicle to generate braking force based on a determination result by the collision determination unit 318. Further, the imaging system 300 is also connected to an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 9B illustrates the imaging system when a front area of a vehicle (a capturing area 350) is captured. The vehicle information acquisition device 320 transmits an instruction to the imaging system 300 or the imaging device 310. Such a configuration can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as the subject vehicle and can be applied to a moving movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is also one of the embodiments of the present invention.

Further, although the example in which the peripheral circuits such as the comparator circuit 40, the storage circuit 50, the horizontal scanning circuit 60, and the like are arranged on one side of the pixel unit 10 has been illustrated in the above embodiments, these peripheral circuits may be arranged on both sides of the pixel unit 10 (the upper side and the lower side of the pixel unit 10 in FIG. 1). In such a case, whether pixel signals are read out to the upper-side peripheral circuit or read out to the lower-side peripheral circuit can be determined on a column basis.

Further, although the configuration in which pixel signals output from the pixel unit 10 are input directly to the comparator circuit 40 has been illustrated in the above embodiments, another circuit may be arranged between the pixel unit 10 and the comparator circuit 40. For example, an amplifier unit may be arranged between the pixel unit 10 and the comparator circuit 40, and pixel signals amplified by the amplifier unit may be input to the comparator circuit 40. In such a case, it is desirable to appropriately switch the gains in the amplifier unit and the comparator circuit 40, respectively.

Further, although the configuration in which the counter circuit 58 connected commonly to the storage units 52 on respective columns is provided has been illustrated in the above embodiments, counter circuits may be arranged on a column basis or a multiple-column basis.

Further, the photoelectric conversion device illustrated in the above first and second embodiments may be used as a device intended to acquire an image, that is, a solid state imaging device. However, application examples of the photoelectric conversion device described in the present specification are not necessarily limited to a solid state imaging device. For example, in a case of application to a device intended to range as described in the above fourth embodiment, an image is not necessarily required to be output. In such a case, it can be said that the device is a photoelectric conversion device that converts optical information into a predetermined electrical signal. A solid state imaging device is one of the photoelectric conversion devices.

Further, the imaging systems illustrated in the above third and fourth embodiments are examples of an imaging system to which the photoelectric conversion device of the present invention may be applied, and an imaging system to which the photoelectric conversion device of the present invention can be applied is not limited to the configuration illustrated in FIG. 8 and FIG. 9A.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-133524, filed Jul. 19, 2019, which is hereby incorporated by reference herein in its entirety.

What is claimed is:

1. A photoelectric conversion device comprising:
a plurality of pixels arranged to form a plurality of columns and each configured to output a pixel signal in accordance with a light amount of incident light;
a reference signal generation circuit that generates a reference signal having a predetermined amplitude;
a reference signal line on which the reference signal is transmitted; and
a plurality of comparator units provided to corresponding ones of the plurality of columns and each configured to receive the pixel signal from the pixel on a corresponding column and the reference signal,
wherein each of the plurality of comparator units includes:
a comparator having a first input node that receives the pixel signal and a second input node that receives the reference signal,
a first capacitor that connects the reference signal line and the second input node to each other,
a second capacitor whose one electrode is connected to the second input node, and
a select circuit that selectively connects the other electrode of the second capacitor to one of the reference signal line and a reference voltage line,
wherein the other electrode of the second capacitor is connected to the reference signal line during an analog-to-digital conversion period in a first mode, and the other electrode of the second capacitor is connected to the reference voltage line during an analog-to-digital conversion period in a second mode,
wherein the select circuit includes a switch circuit including a first switch connected between the reference signal line and the other electrode of the second capacitor and a second switch connected between the other electrode of the second capacitor and the reference voltage line,
wherein each of the plurality of comparator units further includes a third capacitor whose one electrode is connected to the second input node, and wherein the switch circuit further includes a third switch connected between the reference signal line and the other electrode of the third capacitor and a fourth switch connected between the other electrode of the third capacitor and the reference voltage line.

2. The photoelectric conversion device according to claim 1, wherein the switch circuit configures either one of a first state where the first switch is in a conductive state and the second switch is in a nonconductive state and a second state where the first switch is in a nonconductive state and the second switch is in a conductive state.

3. The photoelectric conversion device according to claim 1, wherein the switch circuit configures any one of a third state where the first switch and the third switch are in a conductive state and the second switch and the fourth switch are in a nonconductive state, a fourth state where the first switch and the fourth switch are in a nonconductive state and the second switch and the third switch are in a conductive state, a fifth state where the first switch and the fourth switch are in a conductive state and the second switch and the third switch are in a nonconductive state, and a sixth state where the first switch and the third switch are in a nonconductive state and the second switch and the fourth switch are in a conductive state.

4. The photoelectric conversion device according to claim 1 further comprising a control circuit that switches an amplitude of the reference signal input to the second input node by controlling the switch circuit.

5. The photoelectric conversion device according to claim 1 further comprising a plurality of amplifier units provided to corresponding ones of the plurality of columns and each configured to amplify the pixel signal from the pixels on a corresponding column,
wherein each of the plurality comparator units receives, at the second input node, the pixel signal amplified by the amplifier unit on a corresponding column.

6. The photoelectric conversion device according to claim 1 further comprising a plurality of output lines provided to corresponding ones of the plurality of columns, wherein the pixel signal is output to each of the output lines from each of the pixels on a corresponding column,
wherein each of the plurality of comparator units further includes a fourth capacitor that connects the output line on a corresponding column and the first input node to each other.

7. The photoelectric conversion device according to claim 1, wherein the reference voltage line is a pixel ground line.

8. The photoelectric conversion device according to claim 1, wherein the reference signal is a ramp signal whose signal level changes with a lapse of time.

9. The photoelectric conversion device according to claim 1 further comprising:
a counter circuit that starts a count operation in synchronization with output of the reference signal from the reference signal generation circuit; and
a storage circuit provided to each of the plurality of columns and configured to store, as digital data of the pixel signal, a count value indicated by a count signal output from the counter circuit in accordance with a result of comparison between the pixel signal and the reference signal performed by the comparator unit.

10. An imaging system comprising:
the photoelectric conversion device according to claim 1; and
a signal processing circuit that processes a signal output from the photoelectric conversion device.

11. A movable object comprising:
the photoelectric conversion device according to claim 1;
a distance information acquisition circuit that acquires distance information on a distance to an object, from a parallax image based on signals from the photoelectric conversion device; and
a control circuit that controls the movable object based on the distance information.

12. A photoelectric conversion device comprising:
a plurality of pixels arranged to form a plurality of columns and each configured to output a pixel signal in accordance with a light amount of incident light;
a reference signal generation circuit that generates a reference signal having a predetermined amplitude;
a reference signal line on which the reference signal is transmitted; and
a plurality of comparator units provided to corresponding ones of the plurality of columns and each configured to receive the pixel signal from the pixel on a corresponding column and the reference signal,
wherein each of the plurality of comparator units includes:
a comparator having a first input node that receives the pixel signal and a second input node that receives the reference signal,
a first capacitor that connects the reference signal line and the second input node to each other,
a second capacitor whose one electrode is connected to the second input node,
a select circuit that selectively connects the other electrode of the second capacitor to one of the reference signal line and a reference voltage line, and
wherein the other electrode of the second capacitor is connected to the reference signal line during an analog-to-digital conversion period in a first mode, and the other electrode of the second capacitor is connected to the reference voltage line during an analog-to-digital conversion period in a second mode, and
wherein each of the plurality of comparator units includes a plurality of the second capacitors each having the one electrode connected to the second input node and the other electrode configured to be connected to either one of the reference signal line and the reference voltage line.

13. A photoelectric conversion device comprising:
a plurality of pixels arranged to form a plurality of columns and each configured to output a pixel signal in accordance with a light amount of incident light;
a reference signal generation circuit that generates a reference signal having a predetermined amplitude;
a reference signal line on which the reference signal is transmitted; and
a plurality of comparator units provided to corresponding ones of the plurality of columns and each configured to receive the pixel signal from the pixels on a corresponding column and the reference signal,
wherein each of the plurality of comparator units includes:
a comparator having a first input node that receives the pixel signal and a second input node that receives the reference signal,
a first capacitor that connects the reference signal line and the second input node to each other,
a second capacitor whose one electrode is connected to the second input node, a first switch connected between the reference signal line and the other electrode of the second capacitor, and a second switch connected between the other electrode of the second capacitor and a reference voltage line, wherein the other electrode of the second capacitor is connected to the reference signal line during an analog-to-digital conversion period in a first mode, and the other electrode of the second capacitor is connected to the reference voltage line during an analog-to-digital conversion period in a second mode, and wherein each of the plurality of comparator units further includes:

a third capacitor whose one electrode is connected to the second input node, a third switch connected between the reference signal generation circuit and the other electrode of the third capacitor, and a fourth switch connected between the other electrode of the third capacitor and the reference voltage line.

14. An imaging system comprising:

the photoelectric conversion device according to claim 13; and a signal processing circuit that processes a signal output from the photoelectric conversion device.

15. A movable object comprising:

the photoelectric conversion device according to claim 13;

a distance information acquisition circuit that acquires distance information on a distance to an object, from a parallax image based on signals from the photoelectric conversion device; and a control circuit that controls the movable object based on the distance information.

* * * * *